United States Patent [19]
Suzuki et al.
[11] Patent Number: 5,011,415
[45] Date of Patent: Apr. 30, 1991

[54] RIGHT ANGLE COAXIAL RECEPTACLE

[75] Inventors: Takao Suzuki, Oume; Mamoru Suzuki, Akishima; Yasufumi Hayashi, Tachikawa, all of Japan

[73] Assignee: Japan Aviation Electronics Industry Limited, Tokyo, Japan

[21] Appl. No.: 490,315

[22] Filed: Mar. 8, 1990

[30] Foreign Application Priority Data

Mar. 31, 1989 [JP] Japan .................................. 1-38917

[51] Int. Cl.$^5$ .............................................. H05K 1/00

[52] U.S. Cl. ...................................... 439/63; 439/581; 439/741

[58] Field of Search ............................... 439/578-585, 439/63, 675, 607, 610, 741

[56] References Cited

U.S. PATENT DOCUMENTS 4,377,320 3/1983 Lathrop et al. ..................... 439/585
4,759,729 7/1988 Kemppainen et al. ............ 439/581
4,795,352 1/1989 Capp et al. ........................... 439/63
4,846,719 7/1989 Iwashita ............................... 439/63

*Primary Examiner*—David L. Pirlot
*Attorney, Agent, or Firm*—Pollock, VandeSande and Priddy

[57] ABSTRACT

An insulator having a through hole has at its rear end portion a square-shaped pedestal portion projecting down therefrom, and the pedestal portion has a slot extending forwardly from its rear end face and communicating with the through hole. A center conductor has a contact portion for engagement with the mating connector, a middle portion, and a terminal portion bent at right angles to the axis of the through hole of the insulator. The contact portion projects forwardly of the insulator in its axial direction, the terminal portion passes through the slot of the pedestal portion and projects at right angles to the axis of the through hole, and the middle portion of the center conductor is inserted in the through hole. The insulator carrying the center conductor is housed in a housing portion of an external conductor stamped out of a resilient metallic plate through press work, and the external conductor and the insulator are engaged with each other.

8 Claims, 10 Drawing Sheets

FIG. 5A
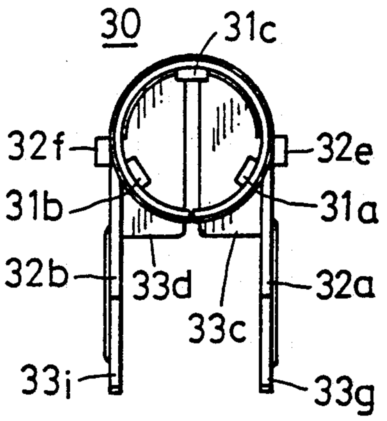
FIG. 5B
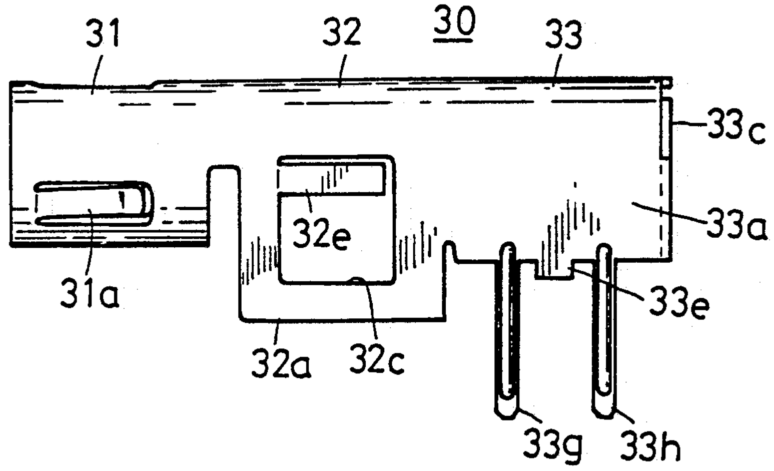
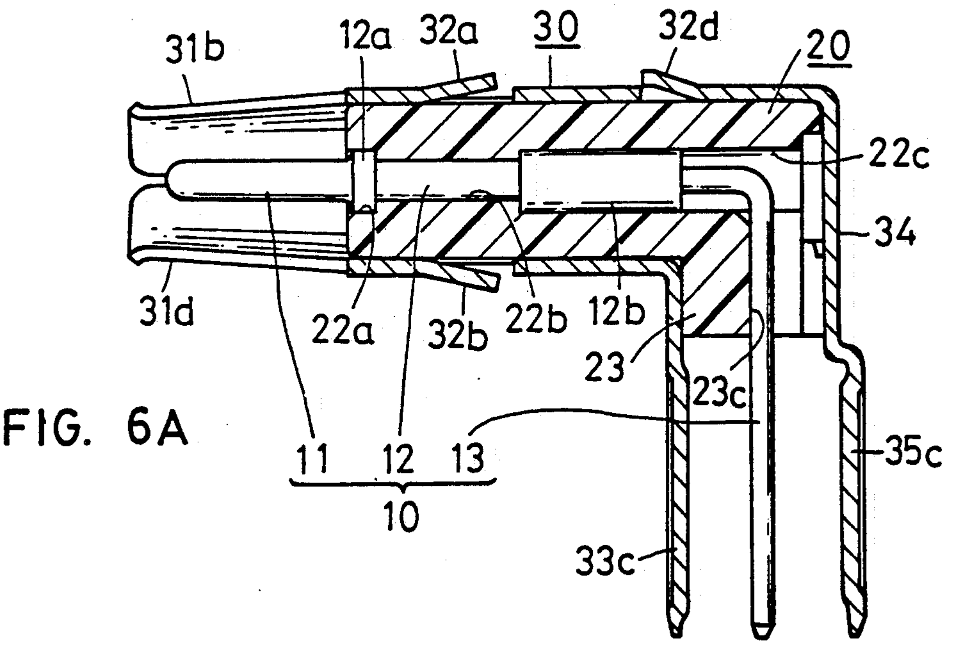
FIG. 6A

RIGHT ANGLE COAXIAL RECEPTACLE

BACKGROUND OF THE INVENTION

The present invention relates to a right angle coaxial receptacle which is mounted on a printed board for external connection.

In a conventional right angle coaxial receptacle of this kind, as shown in FIGS. 1 and 2, a center conductor 10 is composed of a pin conductor 13 for connection with a printed circuit board and a conductor 2 which is formed separately of the pin conductor 13 and has a contact portion 2*a* at its forward end, and an external conductor 30 is composed of a tubular portion 4 and a rectangular parallelpipedic base portion 3 which is formed as a unitary structure with the tubular portion 4 at the rear end thereof and has a chamber 3*a* communicating therewith. The base portion 3 has an opening 3*b* in its bottom, pins 3*c* extending from the underside thereof at four corners for connection to the printed circuit board, and an opening 3*d* in its top. The upper portion of the pin conductor 13 is passed through a hole of an insulator 5 and inserted in the chamber 3*a* through the opening 3*b*. The conductor 2 has its forward portion inserted in an insulator 6 and its rear portion inserted in the chamber 3*a* from the tubular portion 4. The upper end portion of the pin conductor 13 and the rear end portion of the conductor 2 are connected together by solder 7 through the opening 3*d*. A lid 8 is pressed into the opening 3*d* after soldering. The front end 4*a* of the tubular portion 4 is staked to the insulator 6 to reduce its diameter.

The conventional right angle coaxial receptacle shown in FIGS. 1 and 2 requires, for its assembly, the steps of passing the upper portion of the pin conductor 13 through the hole of the insulator 5 and inserting it into the chamber 3*a* through the opening 3*b* inserting the forward portion of the conductor 2 into the insulator 6; inserting the rear portion of the conductor 2 into the chamber 3*a* from the tubular portion 4; soldering the top end portion of the pin conductor 13 and the rear end portion of the conductor 2 through the opening 3*d* pressing the lid 8 into the opening 3*d*; and staking the front end portion 4*a* of the tubular portion 4 to the insulator 6. Accordingly, the assembling of the prior art receptacle is troublesome and the cost therefor is high.

SUMMARY OF THE INVENTION

It is therefore an object of the present invention to provide a right angle coaxial receptacle which is easy to assemble and hence is low in assembling cost.

The right angle coaxial receptacle of the present invention comprises a center conductor, an insulator and an external conductor. The center conductor is a unitary structure composed of a forwardly extending contact portion for engagement with the mating connector and a center conductor terminal extending from the rear end of the contact portion in a direction perpendicular thereto. The insulator has a through hole and has a pedestal portion formed integrally therewith on its rear end portion and protruding therefrom at right angles to the axis of the through hole in a direction to a printed circuit board on which the receptacle is to be mounted. The pedestal portion has a slit which extends from its rear end face in the axial direction of the insulator and communicates with the through hole. The center conductor has its middle portion passed through the through hole of the insulator, with the contact portion projecting out forwardly thereof and the center conductor terminal projecting out of the slot in the pedestal portion of the insulator at right angles thereto.

The external conductor is formed as one piece by stamping out of a metallic sheet through press work and has a plurality of resilient contact pieces in its forward portion, and a rear portion forms an insulator housing portion. At least one external conductor terminal extends from the underside of the insulator housing portion at right angles to its axis. The insulator carrying the center conductor is housed in the housing portion of the external conductor and engaged therewith by engaging means.

The right angle coaxial receptacle of the above construction according to the present invention is easy to assemble because the insulator carrying the center conductor fitted thereto in advance can be mounted in the housing portion of the external conductor.

BRIEF DESCRIPTION OF THE DRAWINGS

FIGS. 5A and 5B are front and side views of an external conductor for use in the first embodiment of the invention;

FIGS. 6A through 6D are sectional, side, rear and bottom views illustrating a second embodiment of the right angle coaxial receptacle of the present invention;

DESCRIPTION OF THE PREFERRED EMBODIMENTS

FIGS. 3A through 3F are front, top, side, bottom, rear and longitudinal sectional views illustrating a first embodiment of the right angle receptacle according to the present invention.

Figure 3A:
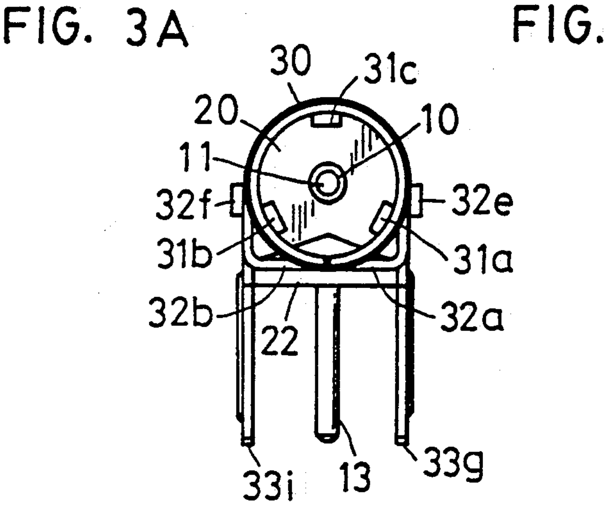
FIGS. 3A through 3F are top, front, side, bottom, rear and sectional views illustrating a first embodiment of the right angle coaxial receptacle of the present invention.
Figure 3E:
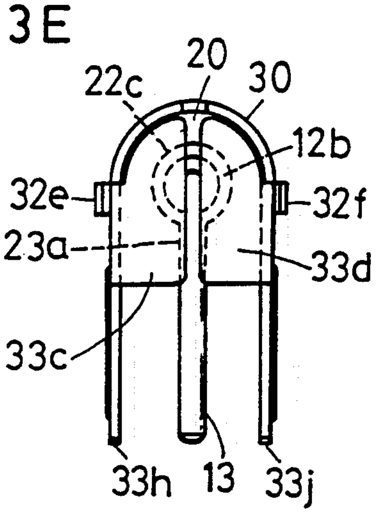
Figure 3B:
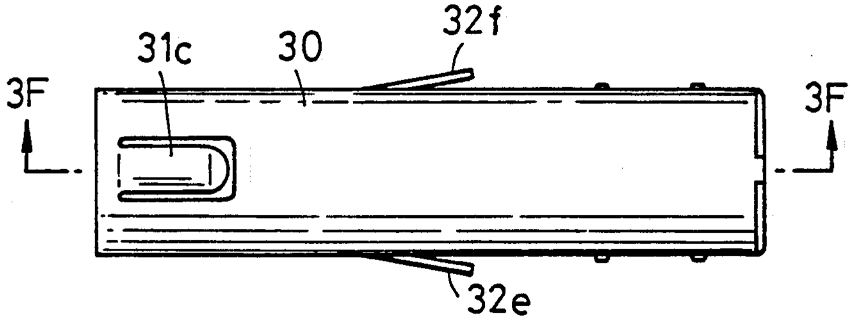
Figure 3C:
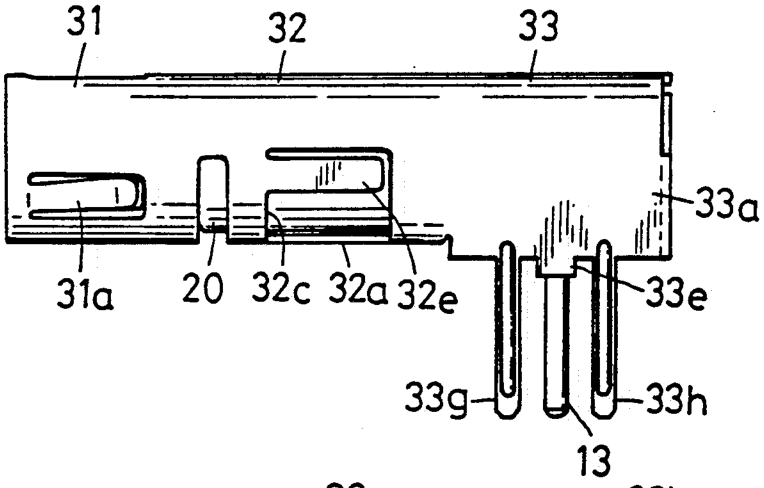
Figure 3D:
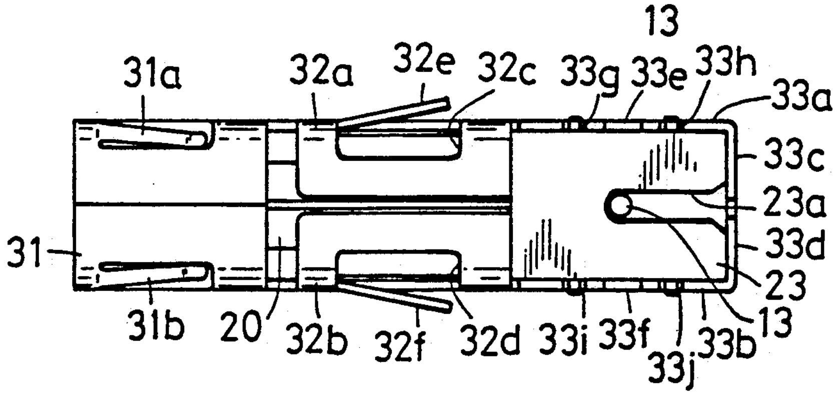
Figure 3F:
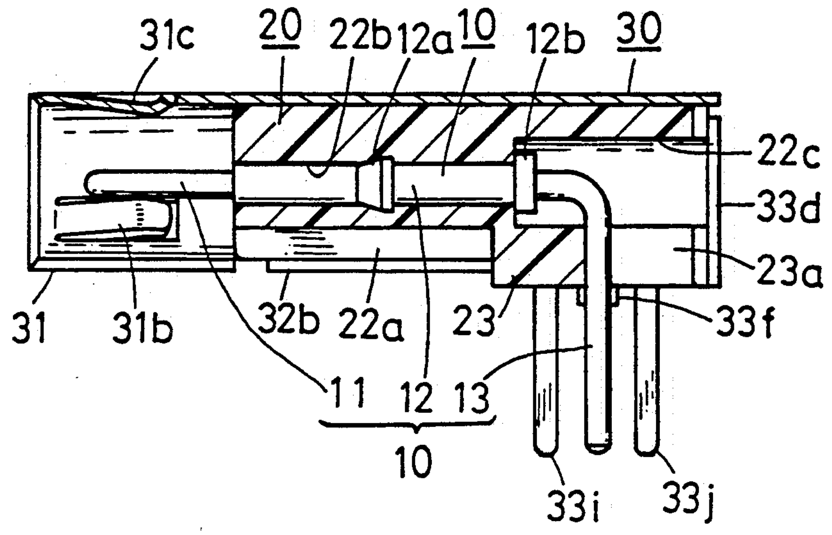

The receptacle comprises a center conductor 10, an insulator 20 and an external conductor 30. The center conductor 10 is a rod-like conductor and has, as shown in FIG. 3F, a middle portion 12 held by an insulator 20, an engaging contact portion 11 formed integrally with the middle portion 12 and projecting out forwardly of the insulator 20, and a center conductor terminal 13 extending from the rear end of the middle portion 12 and bent at right angles thereto for connection to a printed circuit board. In this embodiment the contact portion 11 is pin-shaped. The center conductor 10 has an annular protrusion 12*a* formed integrally therewith substantially at the center of the middle portion 12 and a flange 12*b* formed integrally therewith between the middle portion 12 and the center conductor terminal 13.

Figure 4A:
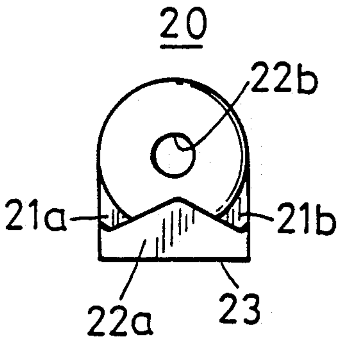
FIGS. 4A through 4C are a front, side and bottom views of an insulator for use in the first embodiment of the invention.
Figure 4B:
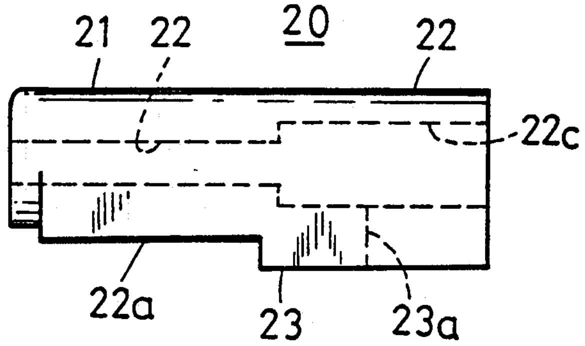
Figure 4C:
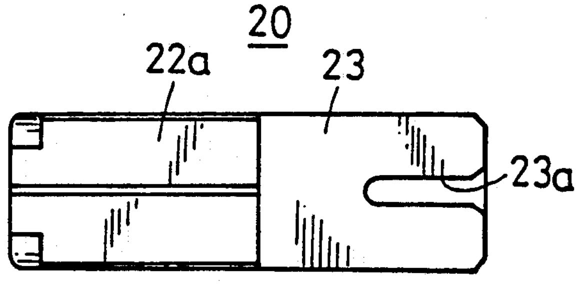

FIGS. 4A, 4B and 4C are front, side and bottom views of the insulator 20, the upper half of which has a semicolumnar cross-section and the lower half of which has a substantially squared cross-section. The insulator 20 has in its front half portion 21 a through hole 22*b* coaxially with the semicolumnar portion, into which the middle portion 12 of the center conductor 10 is pressed, and in its rear half portion 22 a hole 22*c* communicating with the through hole 22*b* but having a greater diameter (see FIG. 3F, too). The underside 22*a* of the front half portion 21 of the insulator 20 is concaved so that it makes an acute angle with each side face; thus, both lower side portions 21*a* and 21*b* of the front half portion 21 of the insulator 20 form edges for engagement. The rear half portion 22 of the insulator 20 has on the underside a substantially rectangular parallelepipedic pedestal portion 23 formed integrally therewith. The pedestal 23 has a slit 23*a* which extends from its rear end face to the vicinity of its center and communicates with the hole 22*a* and into which the terminal 13 of the center conductor 10 is inserted to prevent the conductor 10 from turning.

The external conductor 30 is produced by stamping it out of a resilient metallic plate with a press. FIGS. 5A and 5B show its front and side views before assembling. The external conductor 30 has a cylindrical front end portion 31, which has three spring contact pieces 31*a*, 31*b* and 31*c* formed at about the same angular intervals by cutting U-shaped grooves in the cylindrical portion 31 in its axial direction. The spring contact pieces 31*a* through 31*c* are bent slightly inwardly into the cylindrical portion 31. The middle portion 32 of the external conductor 30 has its upper portion formed semicylindrical and contiguous to the upper portion of the cylindrical portion 31, and the semicylindrical upper portion of the middle portion 32 has a pair of locking pieces 32*a* and 32*b* opposite its lower portion. The locking pieces 32*a* and 32*b* have square holes 32*c* and 32*d*, respectively, so as to facilitate their bending. In this embodiment the middle portion 32 of the external conductor 30 has backward-extending lances 32*e* and 32*f* adjacent the holes 32*c* and 32*d* just above the locking pieces 32*a* and 32*b* so that the receptacle is engaged with a housing (not shown) when incorporated thereinto. The lances 32*e* and 32*f* are bent outwardly. The rear end portion 33 of the external conductor 30 has a semicylindrical portion contiguous to the upper portion of the middle portion 32. The middle portion 32 and the rear end portion 33 of the external conductor 30 form a housing portion for housing the insulator 20. The rear end portion 33 has at its lower end side panel portions 32*a* and 33*b* for holding therebetween the pedestal 22 of the insulator 20. The rear end of the external conductor 30 is closed with end plates 33*c* and 33*d* extending inwardly from the rear edges of the side panel portions 33*a* and 33*b* at right angles thereto. The side panel portions 33*a* and 33*b* have, at the centers of their lower edges, protrusions 33*e* and 33*f* for spacing apart the receptacle and a printed circuit board (not shown) and have, on both sides of the protrusions 33*e* and 33*f*, external conductor terminals 33*g*, 33*h* and 33*i*, 33*j* for connection to the printed circuit board. The external conductor terminals 33*g* through 33*j* each have a rib reinforcement.

Next, a description will be given of assembling of the receptacle of this embodiment. The assembling starts with inserting the contact portion 11 of the center conductor 10 into the through hole 22*b* of the insulator 20 through its hole 22*c*, followed by pressing the middle portion 12 of the center conductor 10 into the through hole 22*b* until the flange 12*b* of the center conductor 10 abuts against the marginal edge of the rear end of the through hole 22*b*. At this time, the center conductor terminal 13 is inserted into the slit 23*a* of the pedestal portion 23 of the insulator 20. Thus, the center conductor 10 is axially fixed to the insulator 20 and is inhibited from turning relative thereto. Next, the assembly of the center conductor 10 and the insulator 20 is inserted from below into the housing portion formed by the middle portion 32 and the rear end portion 33 of the external conductor 30 shown in FIGS. 5A and 5B. In this instance, the contact portion 11 of the center conductor 10 is inserted into the cylindrical portion 31 of the external conductor 30 obliquely from below and then the insulator 20 is pressed up against the external conductor 30 so that the contact portion 11 of the center conductor 10 lies on the axis of the front end portion 31 of the external conductor 30, the insulator 20 lies in the middle and rear end portion 32 and 33 of the external conductor 30 and the rear end face of the insulator 20 touches the end plates 33*e* and 33*d* of the rear end portion 33 of the external conductor 30. Finally, the locking pieces 32*a* and 32*b* of the middle portion 32 of the external conductor 30 are bent inwardly by the edges 21*a* and 21*b* of the insulator 20. The locking pieces 32*a* and 32*b* and the holes 32*c* and 32*d* are sized and shaped so that the locking pieces 32*a* and 32*b* are bent across the holes 32*c* and 32*b* substantially centrally thereof. The locking pieces 32*a* and 32*b* are bent deeply along the concave 22*a* of the insulator 20 in anticipation of their spring-back. Thus, the insulator 20 having the center conductor 10 pressed thereinto and locked thereto is secured tightly in the external conductor 30, and hence is neither movable in its axial direction nor rotatable relative thereto.

The right angle receptacle thus assembled is mounted on a printed circuit board (not shown) by inserting the center conductor terminal 13 and the external conductor terminals 33*g* to 33*j* into a through hole of the printed circuit board and soldering the terminals to a pad on the printed circuit board. Then, the mating connector is fitted into the front end portion 31 of the external conductor 30 in which the contact portion 11 and the spring contact pieces 31*a* through 31*c* are disposed.

As described above, according to the first embodiment, the receptacle can easily be assembled by simply pressing the center conductor into the insulator, inserting the assembly of the center conductor and the insulator into the external conductor and then bending the pair of locking pieces of the external conductor.

FIGS. 6A through 6D are sectional, side, rear and bottom views illustrating a second embodiment of the right angle receptacle of the present invention after assembling.

The receptacle comprises a center conductor 10, an insulator 20 and an external conductor 30.

The center conductor 10 is a rod-like member which has, as shown in FIG. 6A, an engaging contact portion 11 extending forwardly from the middle portion 12 and whose backward portion is bent down substantially at right angles to form the center conductor terminal 13 for connection to a printed board. The engaging contact portion 11, the middle portion 12 and the center conductor terminal 13 are formed as a unitary structure with one another. In this embodiment the engaging contact portion 11 is pin-shaped. The middle portion 12 of the center conductor 10 has formed integrally therewith a flange 12*a* near the engaging contact portion 11 and a flange 12*b* near the center conductor terminal 13.

The insulator 20 is columnar as a whole and has a through hole 22*b* along its axis. The front open end portion of the through hole 22*b* is enlarged in diameter to form an annular recess 22*a* for receiving the flange 12*a*. Further, the through hole 22*b* has another large-diametered portion extending rearwardly from its center to form a hole 22*c*.

FIGS. 7A through 7E are top, front, side, rear and bottom views of the insulator 20 for use in this embodiment. The insulator 20 has a square block-like pedestal portion 23 formed integrally therewith on the under side of its rear end portion. The pedestal portion 23 is tapered on its two side faces 23*a* and 23*b* toward its rear end. The pedestal 23 has a slit 23*c* which communicates with the hole 22*c* and into which the terminal 13 of the center conductor 10 is inserted for preventing its turning. The side faces 23*a* and 23*b* of the pedestal portion 23 have guide grooves 23*d* and 23*e* extending the entire length thereof in the front-to-back direction.

FIGS. 8A through 8E are top, front, side, rear and bottom views showing the external conductor 30 in the form before it is assembled with the center conductor 10 and the insulator 20. The external conductor 30 is produced as one piece by stamping it out of a metallic plate through press work. The external conductor 30 has four forwardly projecting resilient contact pieces 31*a*, 31*b*, 31*c* and 31*d*, which are formed substantially cylindrical as a whole and are biased inwardly. The central portion 32 of the external conductor 30 is bend into a cylindrical configuration to form an insulator housing portion, and there is provided an opening 32*c* in the underside of its rear end portion. In this embodiment the central portion 32 of the external conductor 30 has lances 32*a* and 32*b* in the top and bottom of its forward portion and a protrusion 32*d* in the top of its rear portion so that the receptacle is engaged with a housing (not shown) when incorporated thereinto. The lances 32*a* and 32*b* are bent outwardly.

The rear end portion of the external conductor 30 has a terminal lug 33 extending rearwardly from the bottom of the central portion 32 and across the above-mentioned opening 32*c*. The terminal lug 33 has at its tip an external conductor terminal 33*c*. Extending rear-wardly from the top of the central portion 32 is a substantially circular insulator keep plate portion 34, which is contiguous to a U-shaped engaging portion 35 having a pair of opposed parallel resilient locking pieces 35*a* and 35*b*. Another external conductor terminal 35*c* extends from the center of the U-shape configuration. The inner marginal portions of the resilient locking pieces 35*a* and 35*b* are bent inwardly at right angles to form locking portions 35*d* and 35*e*. The distance between the opposed edges of the locking portions 35*d* and 35*e* is smaller than the maximum width of the pedestal portion 23 of the insulator 20. The external conductor terminals 33*c* and 35*c* have ribs for reinforcement.

Figure 9:
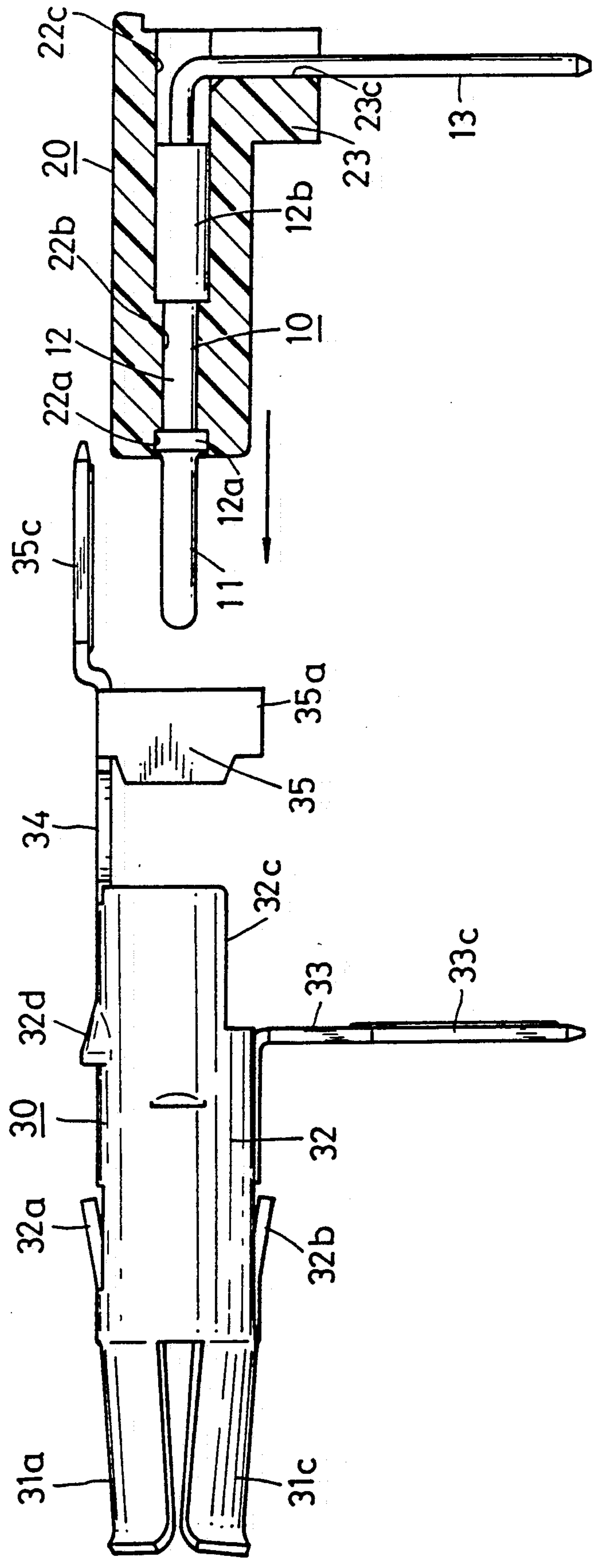
FIG. 9 is a diagram for explaining how the receptacle of the second embodiment is assembled.

Next, a description will be given of assembling of the receptacle of this embodiment. The assembling starts with pressing the center conductor 10 into the insulator 20 to the position where the engaging contact portion 11 inserted into the through hole 22*b* through the hole 22*c* projects out forwardly of the insulator 20 and the flange 12*a* is received in the annular recess 22*a* at the front open end of the through hole 22*b* as shown in FIG. 9. At this time, the terminal 13 of the center conductor 10 is received in the slit 23*c* of the pedestal portion 23, and consequently, the center conductor 10 is fixed to the insulator 20 in its axial direction and is inhibited from turning relative thereto.

Figure 6C:
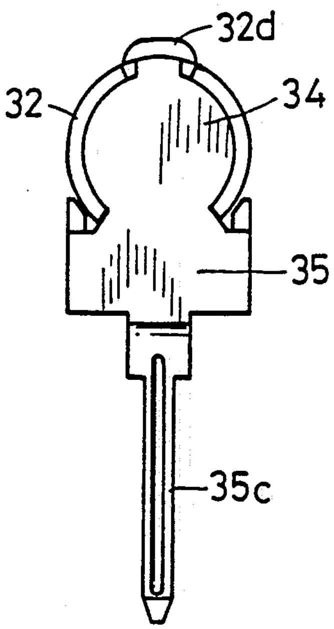
Figure 6B:
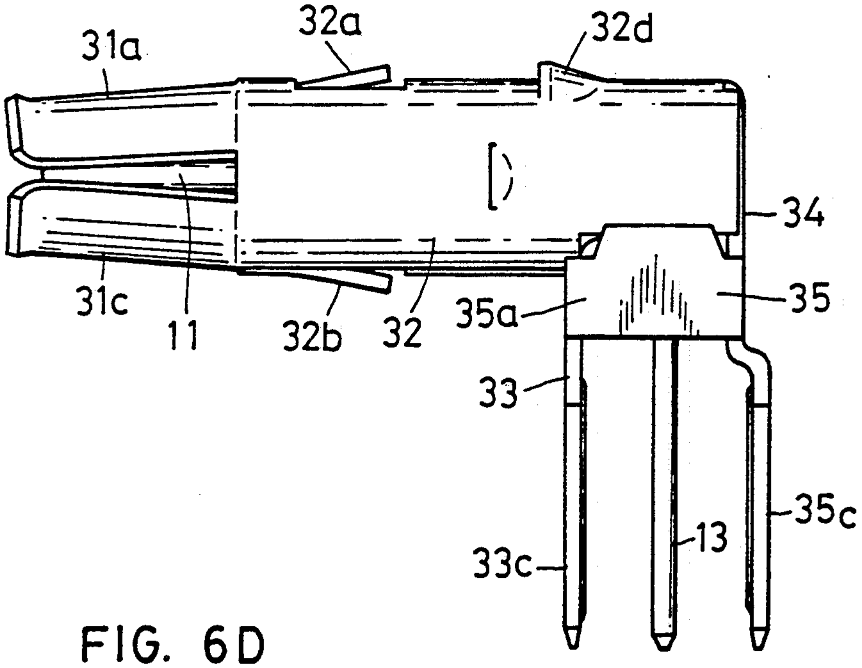
Figure 6D:
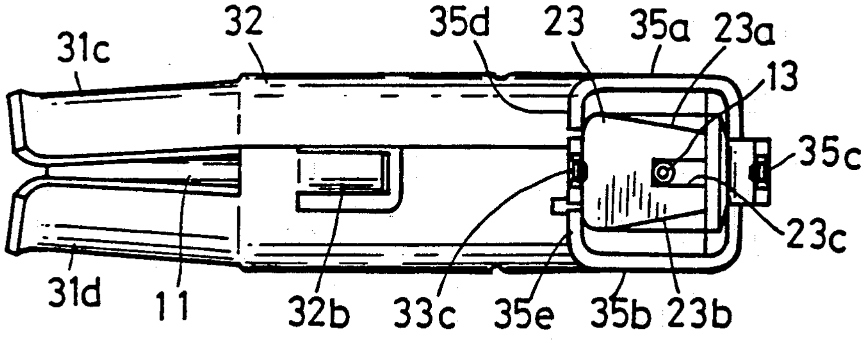
Figure 7A:
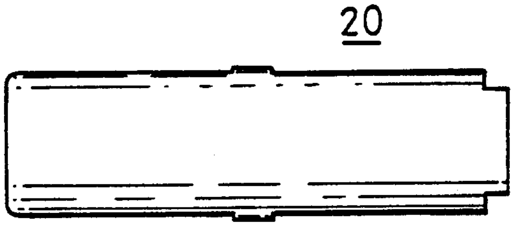
FIGS. 7A through 7E are top, front, side, rear and bottom views of an insulator for use in the second embodiment of the invention.
Figure 7B:
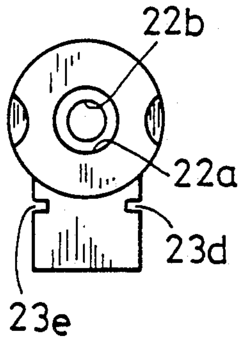
Figure 7C:
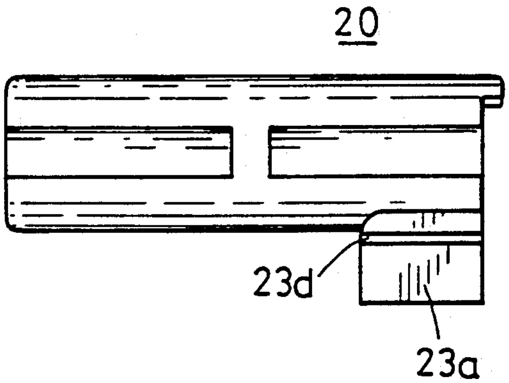
Figure 7D:
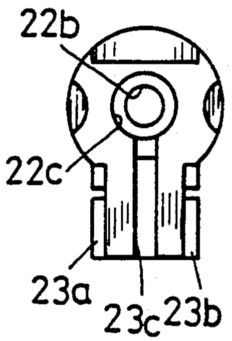
Figure 7E:
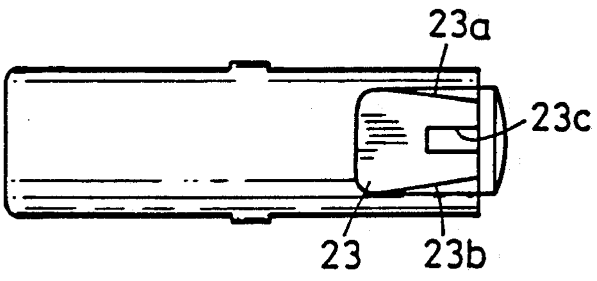
Figure 8A:
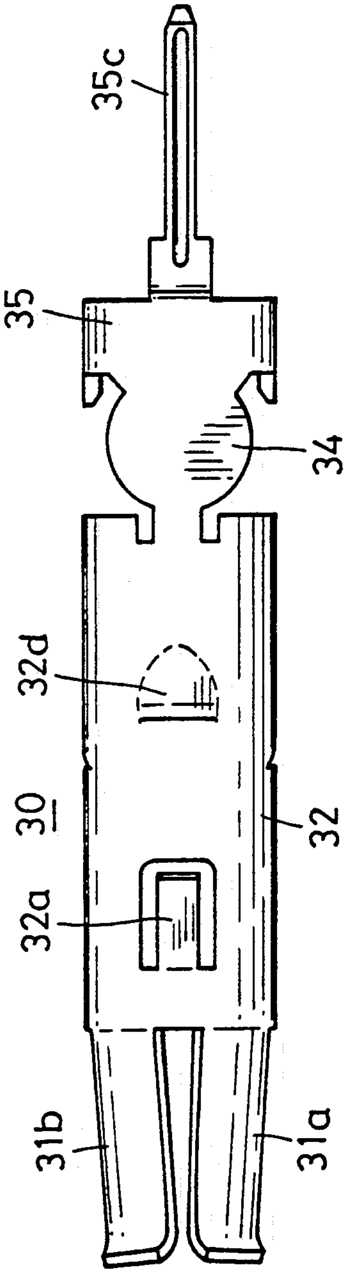
FIGS. 8A through 8E are top, front, side, rear and bottom views of an external conductor for use in the second embodiment of the invention.
Figure 8C:
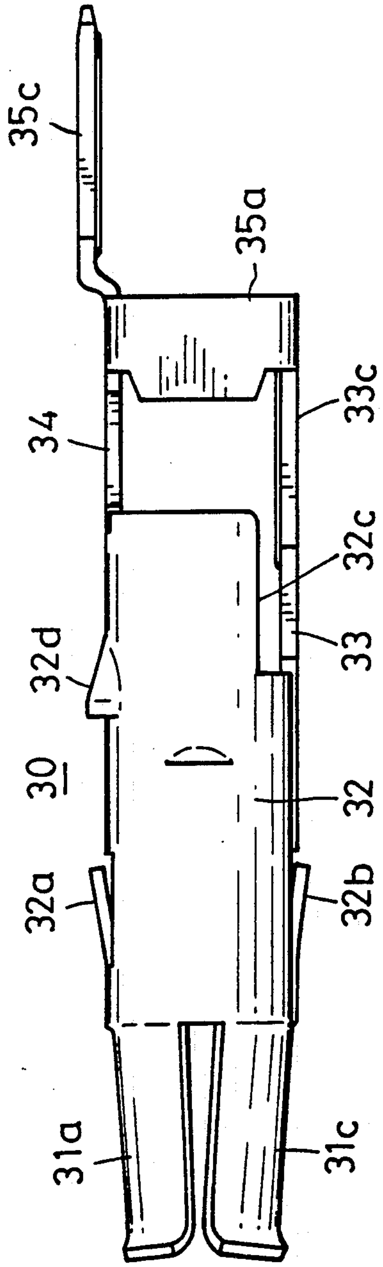
Figure 8B:
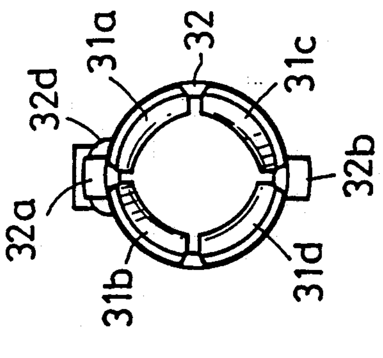
Figure 8D:
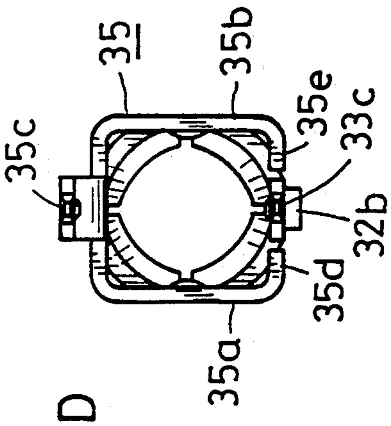
Figure 8E:
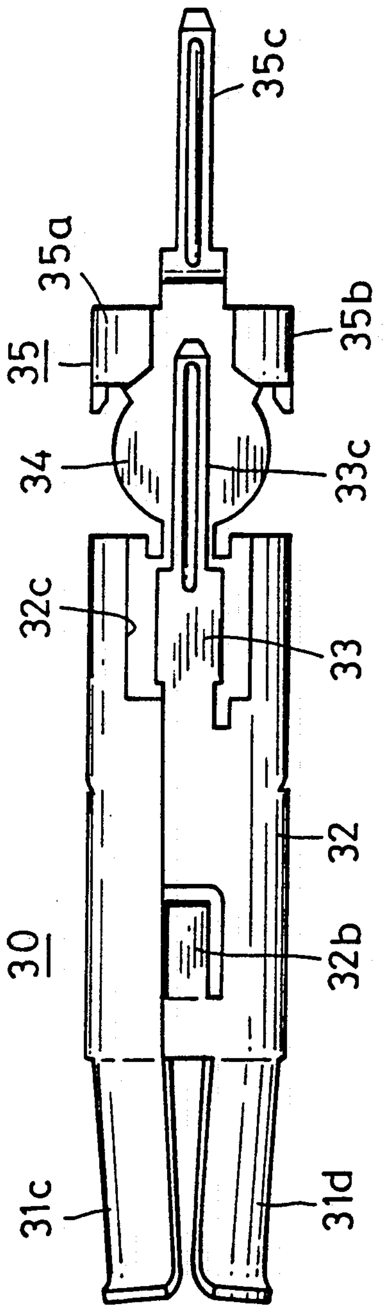
Figure 10:
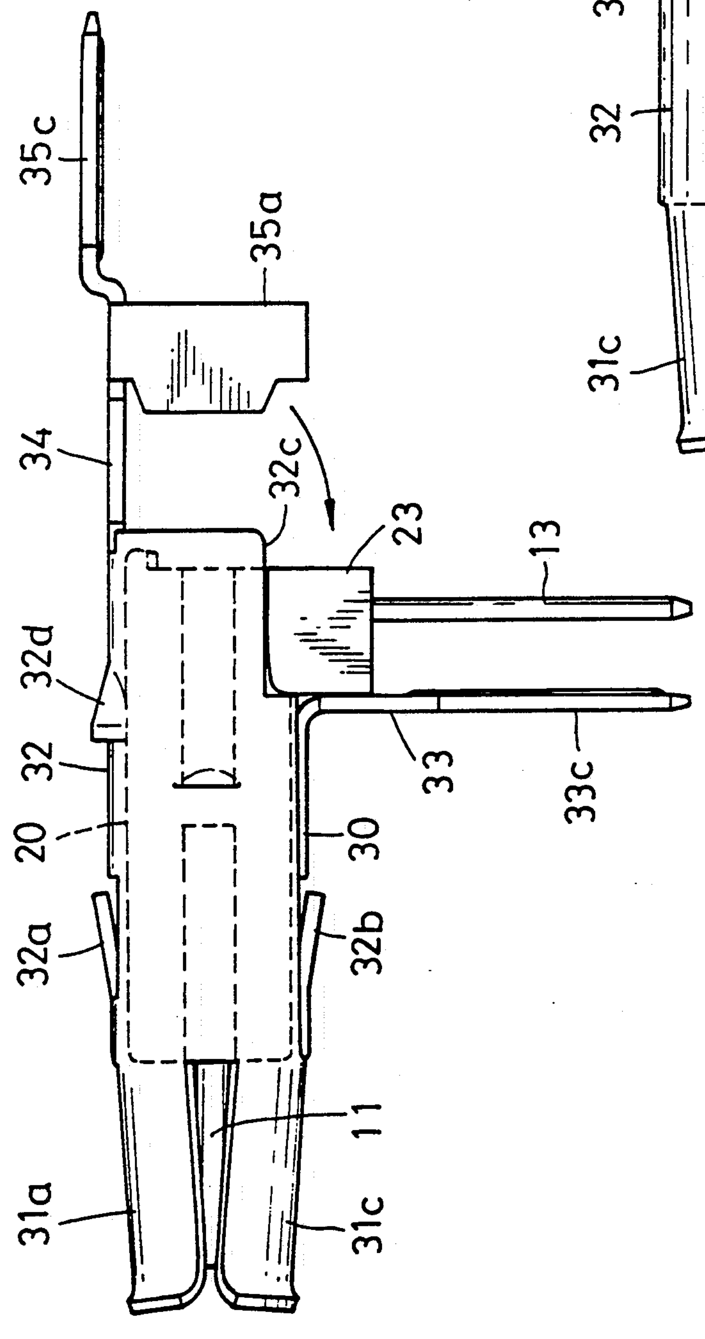
FIG. 10 is a side view for explaining how the receptacle of the second embodiment.

Then, the terminal lug 33 of the external conductor 30 is bent down at right angles as depicted in FIG. 9. After this, the insulator 20 carrying the center conductor 10 is inserted into the center portion 32 of the external conductor 30 while being passed through the pair of resilient locking pieces 35*a* and 35*b* of the keep plate portion 34 of the external conductor 30 as shown. At this time, the locking portions 35*d* and 35*e* of the locking pieces 35*a* and 35*b* pass through the guide grooves 23*d* and 23*e* cut in the pedestal portion 23 of the insulator 20. In this way, the insulator 20 carrying the center conductor 10 is inserted into the external conductor 30 until the front end face of the pedestal portion 23 of the insulator 20 meets the downwardly bent terminal lug 33 of the external conductor 30 as shown in FIG. 10. Finally, the keep plate portion 34 of the external conductor 30 is bent down at right angles so that it extends in parallel to the terminal lug 33 as depicted in FIGS. 6A through 6D. By this, the locking portions 35*d* and 35*e* of the pair of resilient locking pieces 35*a* and 35*b* are guided along the side faces 23*a* and 23*b* of the tapered pedestal portion 23 of the insulator 20 and are resiliently spread out and then locked to the front of the pedestal portion 23 as shown in FIG. 6D. Thus, spring-back of the keep plate portion 34 of the external conductor 30 is prevented and the insulator 20 carrying the center conductor 10 is firmly held in the external conductor 30.

The right angle coaxial receptacle thus assembled is mounted on a printed circuit board (not shown) by inserting the terminal 13 of the center conductor 10 and the terminals 33*c* and 35*c* of the external conductor 30 into through holes of the printed circuit board and soldering the terminals to pads on the printed circuit board. The mating connector can be engaged with the contact portion 11 of the center conductor 10 and the resilient contact pieces 31*a* through 31*d*of the external conductor 30.

Figure 11:
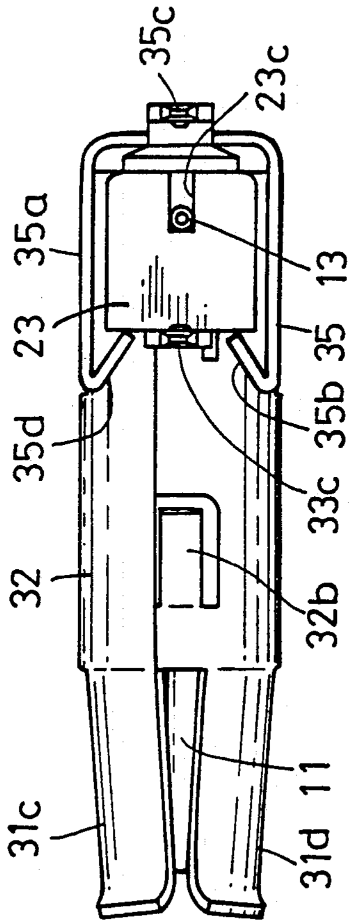
FIG. 11 is a bottom view showing a modified form of the second embodiment.

In this embodiment the locking portions 35*d* and 35*e* of the resilient locking pieces 35*a* and 35*b* may each be bent inwardly at an acute angle, not right angles, as depicted in FIG. 11, in which case the side faces 23*a* and 23*b* of the pedestal portion 23 of the insulator 20 need not be tapered.

As described above, the receptacle of the second embodiment can be assembled by simply inserting the insulator carrying the center conductor into the housing portion of the external conductor and bending the keep plate portion of the external conductor at right angles toward a printed board. This permits easy assembling of the receptacle and affords reduction of its assembling cost. Further, the external conductor is formed as one piece by press work, and hence is easy to work and low-cost.

Figure 1:
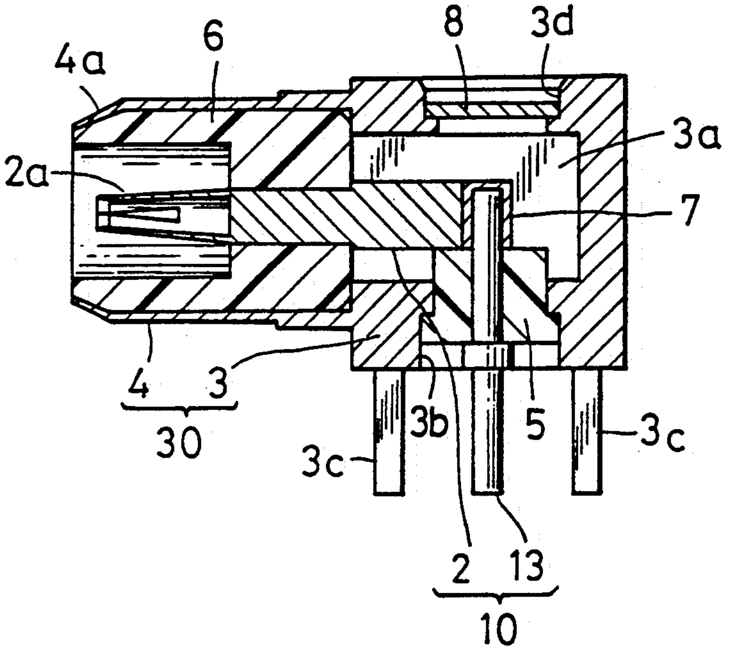
FIG. 1 PRIOR ART
FIG. 1 is a sectional view of a conventional right angle receptacle.
Figure 2:
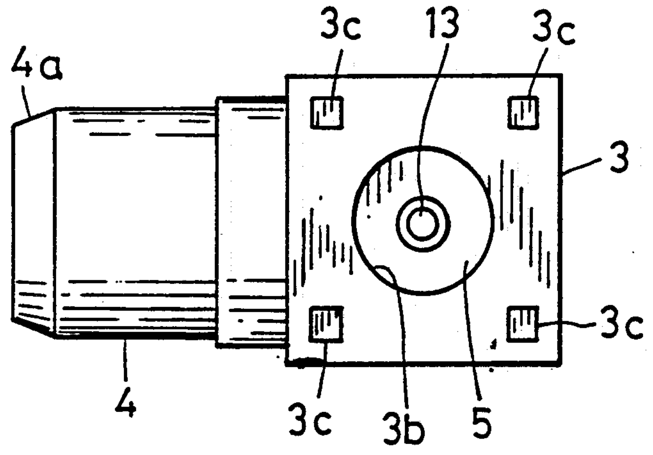
FIG. 2 PRIOR ART
FIG. 2 is its bottom view.

While in the above description the engaging contact portion 11 of the center conductor 10 is shown to be pin-shaped, it may also be in the form of a socket as indicated by 2*a* in FIG. 1.

It will be apparent that many modifications and variations may be effected without departing from the scope of the novel concepts of the present invention.

What is claimed is:

1. A right angle coaxial receptacle comprising:

an external conductor including a forward portion having a plurality of resilient contact pieces formed at substantially equiangular intervals about the center axis of said external conductor and a rear portion formed as a unitary structure with said forward portion and forming a housing portion that is semicyclindrical above said center axis on the side opposite from a printed circuit board on which said receptacle is to be mounted, said external conductor being formed as one piece by stamping it out of a resilient metallic plate through press work, at least one external conductor terminal extending down at right angles to said center axis from said rear portion of said external conductor at a position below said center axis;

an insulator having a through hole coaxial with said center axis and received in said housing portion of said external conductor, said insulator having formed integrally with its rear end portion a substantially square pedestal portion protruding therefrom toward said printed circuit board at right angles to said center axis, said pedestal portion having a slot extending in the direction of said center axis from the rear end face of said pedestal portion and communicating with said through hole; and a center conductor composed of an engaging contact portion extending forwardly on said axis in said forward portion of said external conductor, a rod-like middle portion extending from the rear end of said engaging contact portion and inserted in said through hole of said insulator, and a center conductor terminal extending from the rear end of said middle portion, bent in an L-shape and projecting out through said slot at right angles to said center axis;

said housing portion of said external conductor being substantially cylindrical and having a keep plate portion extending from the rear end edge of said housing portion at the top thereof to form its rear end face receiving the rear end of said insulator, and U-shaped resilient locking means extending from the lower end of said keep plate portion and surrounding said pedestal portion of said insulator from behind.

2. The right angle coaxial receptacle of claim 1, wherein said external conductor terminal extends from the underside of said housing portion along the front end face of said pedestal portion of said insulator.

3. The right angle coaxial receptacle of claim 1 or 2, wherein another external conductor terminal is provided which extends from the center of the U-shaped portion of said resilient locking means.

4. The right angle coaxial receptacle of claim 1 wherein the rear portion of said through hole is greater in diameter than the forward portion thereof and said center conductor has at the rear end of said middle portion a flange greater in diameter than said forward portion of said through hole, said flange being received in said rear portion of said through hole.

5. The right angle coaxial receptacle of claim 1, wherein the tip end portions of said U-shaped resilient locking means are bent inwardly to form locking pieces for engagement with the front end face of said pedestal portion of said insulator.

6. The right angle coaxial receptacle of claim 5, wherein said pedestal portion of said insulator is tapered so that the distance between its two side faces gradually increases toward the front end face of said pedestal portion.

7. A right angle coaxial receptacle comprising:

an external conductor including a forward portion having a plurality of resilient contact pieces formed at substantially equiangular intervals about the center axis of said external conductor and a rear portion formed as a unitary structure with said forward portion and forming a housing portion that is semicylindrical above said center axis on the side opposite from a printed circuit board on which said receptacle is to be mounted, said external conductor being formed as one piece by stamping it out of a resilient metallic plate through press work, at least one external conductor terminal extending down at right angles to said center axis from said rear portion of said external conductor at a position below said center axis;

an insulator having a through hole coaxial with said center axis and received in said housing portion of said external conductor, said insulator having formed integrally with its rear end portion a substantially square pedestal portion protruding therefrom toward said printed circuit board at right angles to said center axis, said pedestal portion having two side faces and a slot extending in the direction of said center axis from the rear end face of said pedestal portion and communicating with said through hole; and a center conductor composed of an engaging contact portion extending forwardly on said axis in said forward portion of said external conductor, a rod-like middle portion extending from the rear end of said engaging contact portion and inserted in said through hole of said insulator, and a center conductor terminal extending from the rear end of said middle portion, bent in an L-shape and projecting out through said slot at right angles to said center axis;

said housing portion of said external conductor having in its forward portion engaging means for engagement with said insulator at a position below said center axis and having in its rearward portion plate portions for covering both side faces of said pedestal portion of said insulator, said engaging means comprising a pair of plate-shaped locking pieces extending down from both sides of said forward portion of said housing portion, and each of said plate-shaped locking pieces having a substantially square hole made therein.

8. A right angle coaxial receptacle comprising:

an external conductor including a forward portion having a plurality of resilient contact pieces formed at substantially equiangular intervals about the center axis of said external conductor and a rear portion formed as a unitary structure with said forward portion and forming a housing portion that is semicylindrical above said center axis on the side opposite from a printed circuit board on which said receptacle is to be mounted, said external conductor being formed as one piece by stamping it out of a resilient metallic plate through press work, at least one external conductor terminal extending down at right angles to said center axis from said rear portion of said external conductor at a position below said center axis;

an insulator having a through hole coaxial with said center axis and received in said housing portion of said external conductor, said insulator having formed integrally with its rear end portion a substantially square pedestal portion protruding therefrom toward said printed circuit board at right angles to said center axis, said pedestal portion having two side faces and a slot extending in the direction of said center axis from the rear end face of said pedestal portion and communicating with said through hole; and a center conductor composed of an engaging contact portion extending forwardly on said axis in said forward portion of said external conductor, a rod-like middle portion extending from the rear end of said engaging contact portion and inserted in said through hole of said insulator, and a center conductor terminal extending from the rear end of said middle portion, bent in an L-shape and projecting out through said slot at right angles to said center axis;

said housing portion of said external conductor having in its forward portion engaging means for engagement with said insulator at a position below said center axis and having in its rearward portion plate portions for covering both side faces of said pedestal portion of said insulator, the lower half portion of said insulator extending forwardly of its pedestal portion below said center axis being substantially square in cross section, and both lower marginal edges of said lower half portion being acute in cross section and engaged with said engaging means of said external conductor.

* * * * *